United States Patent
Yoon

(10) Patent No.: US 7,312,122 B2
(45) Date of Patent: Dec. 25, 2007

(54) SELF-ALIGNED ELEMENT ISOLATION FILM STRUCTURE IN A FLASH CELL AND FORMING METHOD THEREOF

(75) Inventor: Chul Jin Yoon, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 313 days.

(21) Appl. No.: 11/023,277

(22) Filed: Dec. 27, 2004

(65) Prior Publication Data

US 2005/0139899 A1 Jun. 30, 2005

(30) Foreign Application Priority Data

Dec. 27, 2003 (KR) .................. 10-2003-0098332

(51) Int. Cl.
*H01L 21/336* (2006.01)
(52) U.S. Cl. .................. 438/257; 438/423; 257/E21.54
(58) Field of Classification Search ................ 438/404, 438/407, 420, 423, 257
See application file for complete search history.

(56) References Cited

U.S. PATENT DOCUMENTS 5,907,783 A * 5/1999 Kim et al. .................. 438/407
6,316,804 B1 * 11/2001 Templeton et al. ......... 257/315
6,369,421 B1 * 4/2002 Xiang et al. ................ 257/321

* cited by examiner

*Primary Examiner*—W. David Coleman
(74) *Attorney, Agent, or Firm*—Andrew D. Fortney

(57) ABSTRACT

A self-aligned element isolation film structure in a flash memory cell and a forming method thereof are disclosed. An example method of forming a self-aligned element isolation film structure in a flash memory cell forms an insulating layer on a semiconductor substrate and forms a floating gate pattern on the insulating layer. The example method selectively implants ions in a portion of the insulating layer exposed by the floating gate pattern and forms a self-aligned element isolation film on the floating gate pattern by oxidizing and growing the portion of the insulating layer to which the ion implantation is performed.

7 Claims, 2 Drawing Sheets

SELF-ALIGNED ELEMENT ISOLATION FILM STRUCTURE IN A FLASH CELL AND FORMING METHOD THEREOF

TECHNICAL FIELD

The present disclosure relates to a semiconductor device, and more particularly, to a self-aligned element isolation film structure in a flash memory cell and a forming method thereof.

BACKGROUND

In general, flash memory devices, which are nonvolatile memory devices, comprise a stacked structure of a floating gate and a control gate. An element isolation process for isolating elements is performed between the floating gates. Such an element isolation process is performed on a substrate before a process of forming the floating gates, and a shallow trench isolation (STI) process is typically used to isolate the elements.

When the element isolation is implemented using the STI process, the floating gate overlaps the STI element isolation film. The overlapping of the floating gate on the STI element isolation film causes reduction of the element area such that the size reduction of a cell array is obstructed or inhibited. Specifically, in the conventional element isolation process such as the STI process of isolating the elements in a flash memory cell region, a silicon nitride film is deposited, a patterning process of forming a field region is performed, a dry etching process is performed, a chemical vapor deposition (CVD) process is performed with an insulating material, a polishing process is performed, and a wet etching process of etching the deposited silicon nitride film is then performed.

A flash gate process is performed after the element isolation process. Specifically, after the element isolation process, the floating gate forming process is performed as the flash gate forming process. Because the floating gate process is performed after the element isolation process, the floating gates must share a portion of the insulating element isolation film made of an insulating material for reliable isolation. The shared portion affects the cell size, thereby causing a problem in the flash memory device of which the cell size is particularly important.

DETAILED DESCRIPTION

In general, the examples described herein provide an element isolation film structure in a flash memory cell capable of reducing the size of a cell array of the flash memory device. An example method of forming a self-aligned element isolation film structure in a flash memory cell forms an insulating layer on a semiconductor substrate; forms a floating gate pattern on the insulating layer; selectively implants ions in a portion of the insulating layer that is exposed by the floating gate pattern; and forms a self-aligned element isolation film on the floating gate pattern by oxidizing and growing the portion of the insulating layer to which the ion implantation is performed.

The forming of the floating gate pattern may comprise forming a photo resist pattern, in which an element isolation region is exposed, on the floating gate layer and selectively etching the exposed portion of the floating gate layer using the photo resist pattern as an etching mask to expose the surface of the insulating layer.

The example method may further comprise heating the insulating layer to which the ion implantation has been performed. The floating gate pattern may be made of a poly silicon film and the poly silicon film may be used as an ion implantation mask for shielding a portion of the insulating layer under the floating gate pattern at the time of the ion implantation.

An example self-aligned element isolation structure in a flash memory cell includes a floating gate pattern formed on a semiconductor substrate with an insulating layer interposed therebetween and an element isolation film which is grown in a self-aligned manner at the side of the floating gate patterns with a thickness larger than that of the insulating layer to fill a space between the floating gate patterns.

Using the example method and apparatus described herein, it is possible to provide a method of forming an element isolation film in a flash memory cell capable of reducing a size of cell array of flash memory device.

Figure 1:
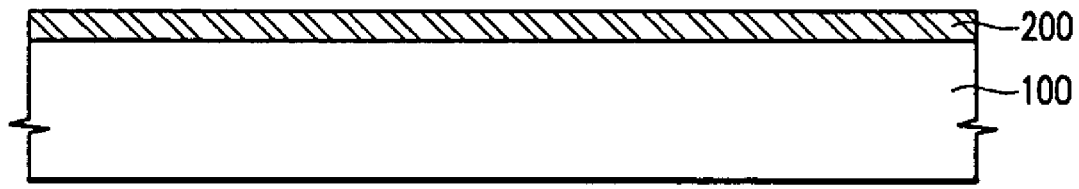
FIGS. 1 to 4 are schematic sectional views explaining an example self-aligned element isolation film structure in a flash memory cell and an example forming method thereof.

Now referring to FIG. 1, in forming the self-aligned element isolation film, an insulating layer 200 as a tunnel dielectric layer is formed on a semiconductor substrate 100. At this time, in contrast to known methods, the element isolation is not performed before forming the insulating layer 200.

Figure 2:
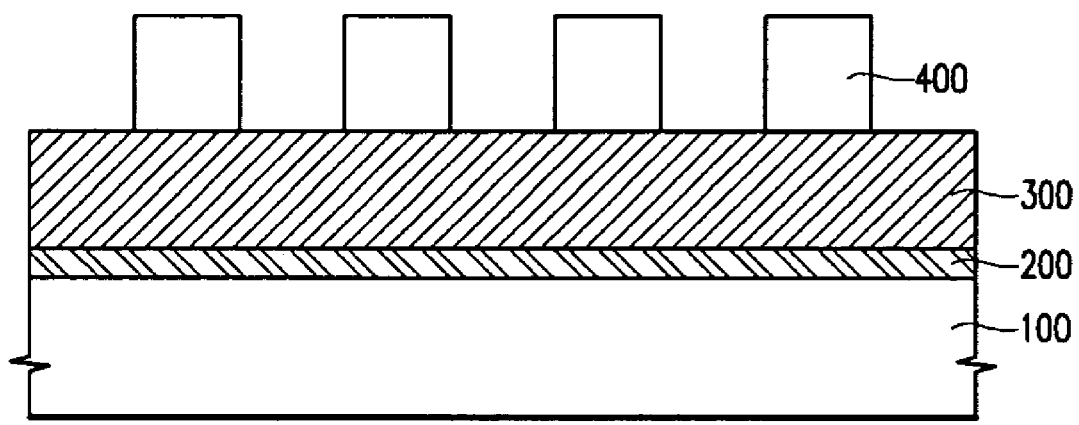

Referring to FIG. 2, a conductive floating gate layer 300, for example, a conductive poly silicon film used for a floating gate of a flash memory device is formed on the insulating layer 200. The poly silicon film can be formed by a chemical vapor deposition (CVD) method. Then, a photo resist pattern 400 used as an etching mask at the time of patterning the floating gate 300 is formed. The photo resist pattern 400 is formed to expose a portion of the floating gate layer 300 where a field region for setting an active region to be formed with the floating gate is located.

Figure 3:
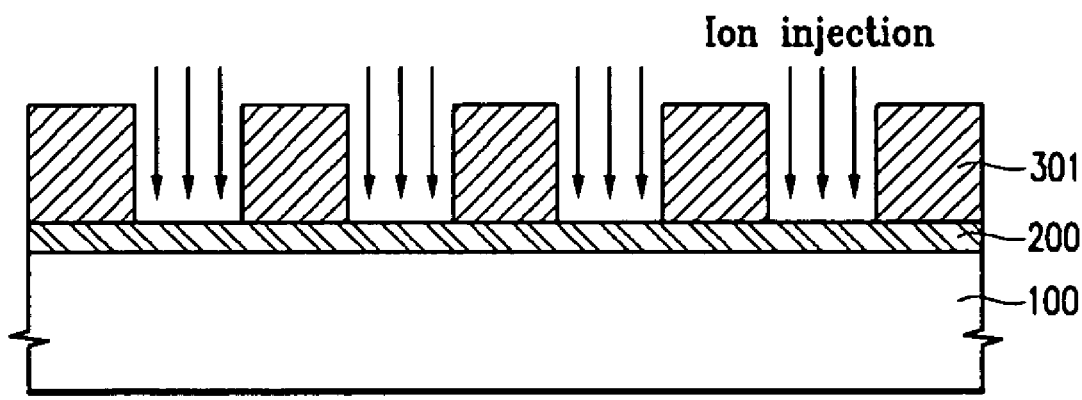

Referring to FIG. 3, by patterning the floating gate layer 300, that is, by selectively etching and removing a portion exposed by the photo resist pattern 400, a floating gate pattern 301 is formed. At this time, the insulating layer 200 under the floating gate layer 300 is exposed. Specifically, it is preferable to perform the patterning so that the insulating layer 200 is not removed by the etching process.

Further, an ion implantation process is performed on the exposed portion of the insulating layer 200. In a portion of the insulating layer 200 which is shielded by the floating gate pattern 301, the floating gate pattern 301 selectively prevents the ion implantation.

Figure 4:
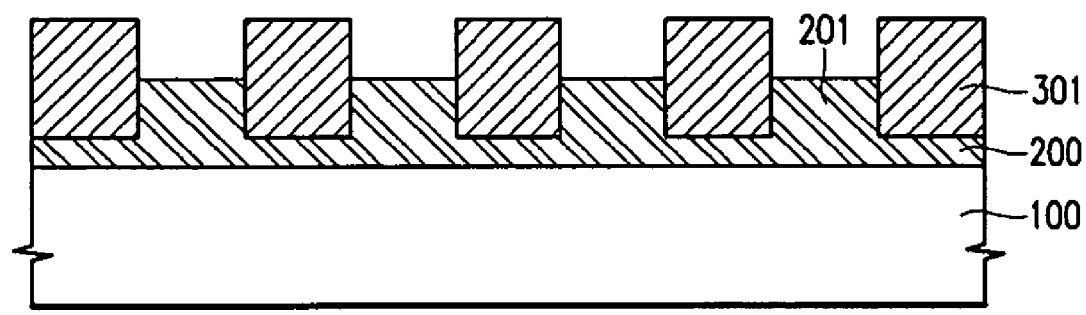

Referring to FIG. 4, if oxidation is performed after performing the ion implantation on a portion of the insulating layer 200, which will be an isolated region, and performing a post-treatment of the ion implantation, for example, a heat treatment, the portion of the insulating layer 200 which is exposed by the floating gate pattern is again oxidized and grown. Specifically, this portion grows thicker by the oxidation than the insulating layer 200. Therefore, the thick insulating portion 201 is formed to fill the spaces between the floating gate patterns 301, such that the isolation between the floating gate patterns 301 or the element isolation is accomplished by the insulating material portion 201 formed during the oxidation. Then, a control gate and the like is formed on the floating gate pattern 301 to complete the flash memory device.

Using the example method described above, when cell regions are formed in a flash memory device, it is not necessary to first perform the process of isolating the elements, that is, the element isolation process, and it is possible to form the isolation portion between the elements in a self-aligned manner using the poly silicon film as the floating gate. Therefore, it is possible to compensate for the area of the overlapped portion between the floating gate and the inter-elements isolation portion. Because the cell array includes a plurality of cells, it is important to make the cell size small in the flash memory device. Using the example method described herein, it is also possible to prevent the floating gate and the element isolation film from overlapping each other, such that it is effective for securing a small cell size.

While the examples herein have been described in detail with reference to example embodiments, it is to be understood that the coverage of this patent is not limited to the disclosed embodiments, but, on the contrary, is intended to cover various modifications and equivalent arrangements included within the sprit and scope of the appended claims.

What is claimed is:

1. A method of forming a self-aligned element isolation film structure in a flash memory cell, the method comprising:

forming an insulating layer on a semiconductor substrate;
   forming a floating gate pattern on the insulating layer;
   selectively implanting ions in a portion of the insulating layer which is exposed by the floating gate pattern; and
   forming a self-aligned element isolation film on the floating gate pattern by oxidizing and growing the portion of the insulating layer to which the ion implantation is performed.

2. The method of claim 1, wherein forming the floating gate pattern comprises forming a photo resist pattern in which an element isolation region is exposed, on the floating gate layer and selectively etching the exposed portion of the floating gate layer using the photo resist pattern as an etching mask to expose the surface of the insulating layer.

3. The method of forming of claim 1, further comprising heating the insulating layer after the ions have been selectively implanted therein.

4. The method of claim 1, wherein the floating gate pattern comprises a polysilicon film, and the polysilicon film is used as an ion implantation mask for shielding a portion of the insulating layer under the floating gate pattern at the time of selectively implanting the ions.

5. The method of claim 1, wherein the self-aligned element isolation film is grown thicker than the insulating layer.

6. The method of claim 2, wherein the exposed portion of the floating gate layer is selectively etched without removing the exposed insulating layer.

7. The method of claim 4, wherein forming the polysilicon film comprises chemical vapor deposition (CVD).

* * * * *